(12) United States Patent
Patterson et al.

(10) Patent No.: US 6,541,794 B1
(45) Date of Patent: Apr. 1, 2003

(54) IMAGING DEVICE AND METHOD

(75) Inventors: Jennifer J. Patterson, Mesa, AZ (US); Clifford I. Drowley, Scottsdale, AZ (US); Shrinath Ramaswami, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 8 days.

(21) Appl. No.: 09/652,643

(22) Filed: Aug. 31, 2000

(51) Int. Cl.⁷ .................... H01L 29/06; H01L 29/04; H01L 31/036; H01L 31/112; H01L 27/14

(52) U.S. Cl. .................... 257/59; 257/24; 257/59; 257/257; 257/258; 257/290; 257/291; 257/292; 257/431

(58) Field of Search .................... 257/24, 59, 257, 257/258, 290, 291, 292, 431

(56) References Cited

U.S. PATENT DOCUMENTS

| | | | | |
|---|---|---|---|---|
| 4,131,950 A | * | 12/1978 | van Santen | 257/236 |
| 4,242,695 A | * | 12/1980 | Ouchi et al. | 257/292 |
| 4,521,896 A | * | 6/1985 | Borsuk et al. | 257/216 |
| 4,646,119 A | * | 2/1987 | Kosonocky | 257/239 |
| 5,315,102 A | * | 5/1994 | Abe et al. | 250/208.1 |
| 5,488,239 A | | 1/1996 | Jung | 257/231 |
| 5,854,100 A | | 12/1998 | Chi | |
| 5,949,064 A | * | 9/1999 | Chow et al. | 250/208.1 |
| 5,949,483 A | * | 9/1999 | Fossum et al. | 250/208.1 |
| 5,969,922 A | * | 10/1999 | Pezzani | 257/528 |
| 6,046,466 A | * | 4/2000 | Ishida et al. | 257/257 |
| 6,061,093 A | * | 5/2000 | Yonemoto | 250/208.1 |
| 6,069,365 A | * | 5/2000 | Chow et al. | 250/208.1 |
| 6,140,630 A | * | 10/2000 | Rhodes | 250/208.1 |
| 6,166,769 A | * | 12/2000 | Yonemoto et al. | 348/241 |
| 6,243,131 B1 | * | 6/2001 | Martin | 348/147 |
| 6,437,311 B2 | * | 8/2002 | Tsang | 250/214.1 |
| 2001/0017381 A1 | * | 8/2001 | Miida | 257/214 |

FOREIGN PATENT DOCUMENTS

EP         0954032         3/1999

* cited by examiner

Primary Examiner—David Nelms
Assistant Examiner—Ly Duy Pham

(57) ABSTRACT

An imaging circuit (10) is formed on a semiconductor substrate (40) having first and second regions (41, 42) for capturing a light signal (LIGHT) to produce first and second charges, respectively. A conductive material (52, 53) is extended from the first region to the second region for controlling the first and second charges in response to a control signal (COL1, ROW1) to produce an output signal ($V_{OUT}$) of the imaging circuit.

15 Claims, 2 Drawing Sheets

IMAGING DEVICE AND METHOD

The present invention relates in general to semiconductor devices, and more particularly to integrated image capturing circuits fabricated on semiconductor substrates.

Most integrated imaging circuits are formed to include arrays of photoactive pixel circuits suitable for capturing images projected on the arrays. The pixel circuits typically include photoactive or photoreceptive devices as well as control and selection transistors. Such integrated imaging circuits are used in copiers, scanners, digital cameras and other devices.

The quality of the captured images typically is determined by the fill factor of the arrays, i.e., the portion of the array which is occupied by the photoactive devices. An array with a high fill factor captures more of the light projected on the array and consequently produces a higher quality captured image.

Previous integrated imaging circuits suffer from a high cost due to the large die area occupied by the arrays of pixel circuits. However, if the area of each pixel circuit is decreased, the fill factor is reduced and the quality of the captured images is degraded.

Hence, there is a need for an imaging circuit which can be fabricated at a reduced cost while maintaining or improving the quality of captured images.

DETAILED DESCRIPTION OF THE DRAWINGS

In the figures, elements having the same reference numbers have similar functionality.

Figure 1:
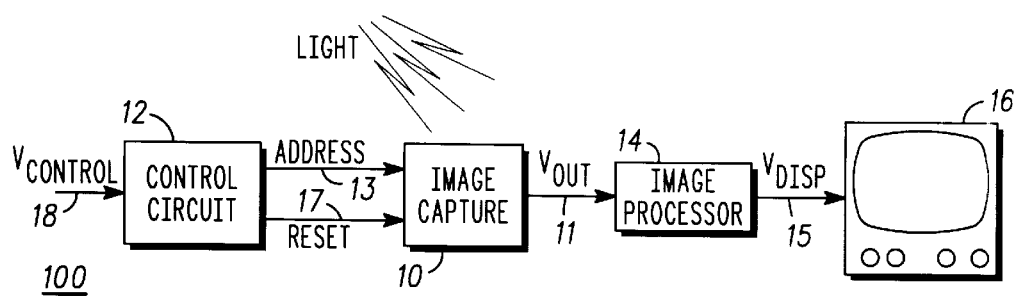
FIG. 1 is a block diagram of an imaging system.

FIG. 1 is a block diagram of an imaging system 100 including an image capture circuit 10, a control circuit 12, an image processor 14 and an output device 16 all intercoupled as depicted. Imaging system 100 may be utilized in a copier, a scanner, a digital camera, or other imaging device.

Image capture circuit 10 includes an array of photoactive pixel circuits whose surfaces receive LIGHT projected from an image. The LIGHT energizes the pixel circuits to produce pixel signals as a function of the light energy received. Decoding circuits select among the pixel circuits to produce an analog image signal $V_{OUT}$ at a node 11 which is representative of the captured image.

Control circuit 12 has an input 18 for receiving a user initiated control signal $V_{CONTROL}$ and an output bus 13 that provides digital ADDRESS data for selecting pixels. A digital initialization signal RESET is produced at a node 17 prior to capturing an image in order to clear the array of residual signals from a previous capture. Control signal $V_{CONTROL}$ allows a user to control exposure time, the amount of zoom, or to provide other imaging features.

Image processor 14 receives image signal $V_{OUT}$ and produces a digital display signal $V_{DISP}$ in a format suitable for operating output device 16. Image processor includes an amplifier, a decorrelation circuit to reduce system noise, and an analog to digital converter to convert image signal $V_{OUT}$ to digital display data $V_{DISP}$.

Output device 16 is shown as a display monitor where imaging system 100 is configured as a camera. In the alternative, if imaging system 100 is configured as a copier or scanner, output device 16 may be a printer. As a further alternative, output device 16 may be a storage or other output device.

Figure 2:
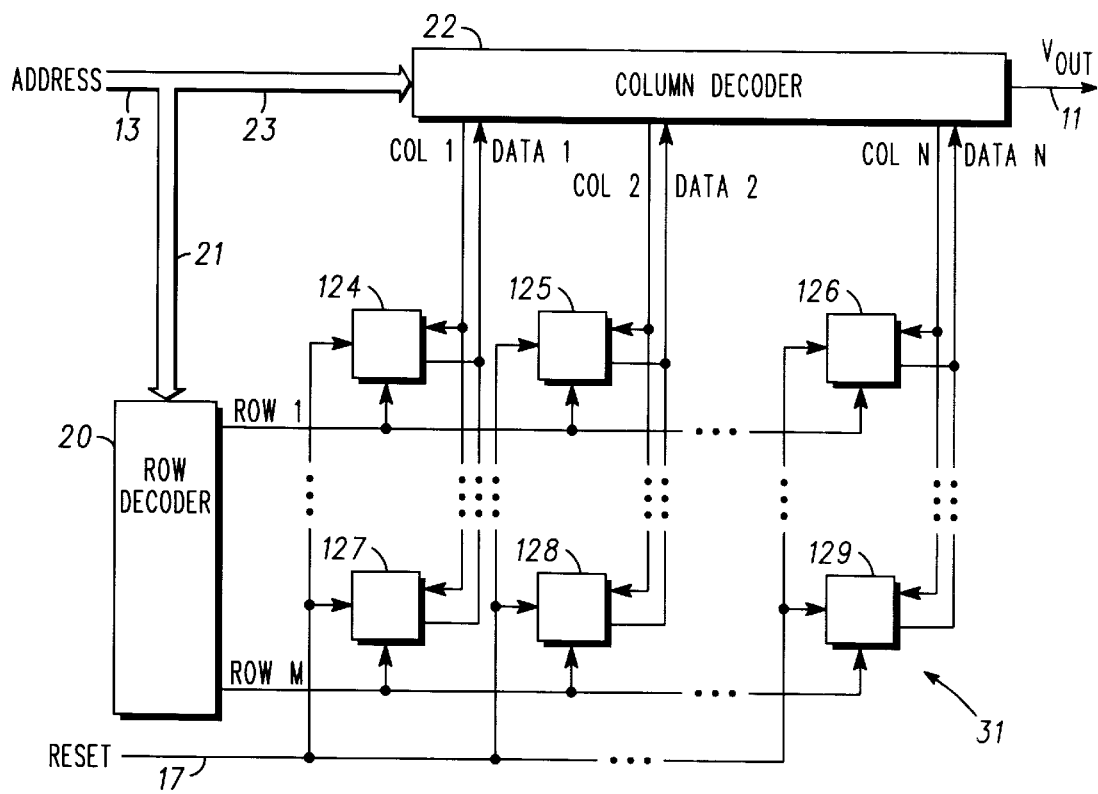
FIG. 2 is a block diagram of an image capture circuit in accordance with the present invention.

FIG. 2 is a block diagram of image capture circuit 10, including a row decoder 20, a column decoder 22, and an array 31 of pixel circuits 124–129. Array 31 is organized into M rows and N columns of pixel circuits as shown, where M and N are integers. ADDRESS data is received on bus 13 for selecting among pixel circuits 124–129 to produce image signal $V_{OUT}$ on node 11.

Row decoder 20 decodes a row portion of ADDRESS data received on bus 21 for activating one of the row selection signals ROW1 through ROWM to select a corresponding row of pixel circuits as is known. Column decoder 22 decodes a column portion of ADDRESS data received on bus 23 for activating one of the column selection signals COL1 through COLN to select a corresponding column as known. The pixel circuit lying in the selected row and column is thereby selected. Column decoder 22 includes sense amplifiers for receiving one of the pixel signals DATA1 through DATAN produced by the selected pixel circuit. For example, where ROW1 is activated on a row line 25 while COL1 is activated on a column line 27, pixel circuit 124 is selected and captured image information is routed to a data line 27 as pixel signal DATA1. Column decoder 22 senses and amplifies pixel signal DATA1 to produce image signal $V_{OUT}$.

Pixel circuits 124–129 are selectable in any order by modifying ADDRESS data, effectively providing random access to array 31 to facilitate viewing features such as zooming.

Figure 3:
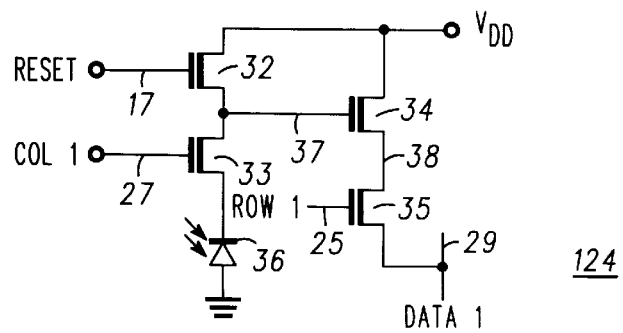
FIG. 3 is a schematic diagram of a pixel circuit suitable for use in the FIG. 2 circuit.

FIG. 3 is a schematic diagram of pixel circuit 124, including a photoactive device 36, an initializing transistor 32, a charge transfer transistor 33, a source follower transistor 34 and an output transistor 35 intercoupled as depicted. Photoactive device 36 comprises a pinning diode which generates a charge in response to light energy. Alternatively, photoactive device 36 may be a phototransistor or other photoresponsive device. Transistors 32–35 are N-channel transistors fabricated on a complementary metal-oxide-semiconductor integrated circuit process.

Figure 4:
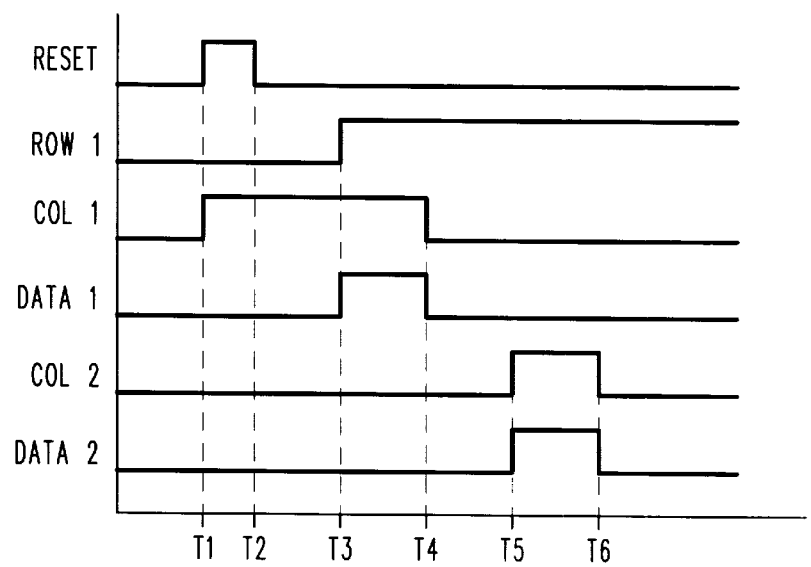
FIG. 4 is a timing diagram of the operation of the FIG. 3 pixel circuit.

The operation of pixel circuit 124 in capturing an image can be seen by referring to the timing diagram of FIG. 4. Transistors 32–35 initially are turned off. At time T1, pixel circuit 124 is initialized by setting initialization signal RESET and column selection signal COL1. Transistors 32 and 33 turn on to clear residual charge from a prior capture and to set a floating node 37 to a known potential approximately one conduction threshold below a power supply voltage VDD operating at 3.0 volts.

At time T2, initialization signal RESET is cleared, turning off transistor 32. Transistor 33 remains turned on to transfer the charge from photoactive device 36 to set floating node 37 to a potential indicative of the light energy. Transistor 33 typically is fabricated to have a zero volt gate-source conduction threshold to ensure that as much of the charge as is practical is transferred to floating node 37.

Transistor 34 operates as a source follower which buffers the signal on floating node 37 to produce a shifted signal on node 38. At time T3, row selection signal ROW1 is set, turning on transistor 35 for coupling the shifted signal to data line 27 as pixel signal DATA1.

It should be noted that alternative timing sequences can be used for operating pixel circuit 124. For example, column select signal COL1 can be turned on at time T3 rather than T1. This is depicted by example for COL2 at T5 which yields DATA2 a the same time.

Figure 5:
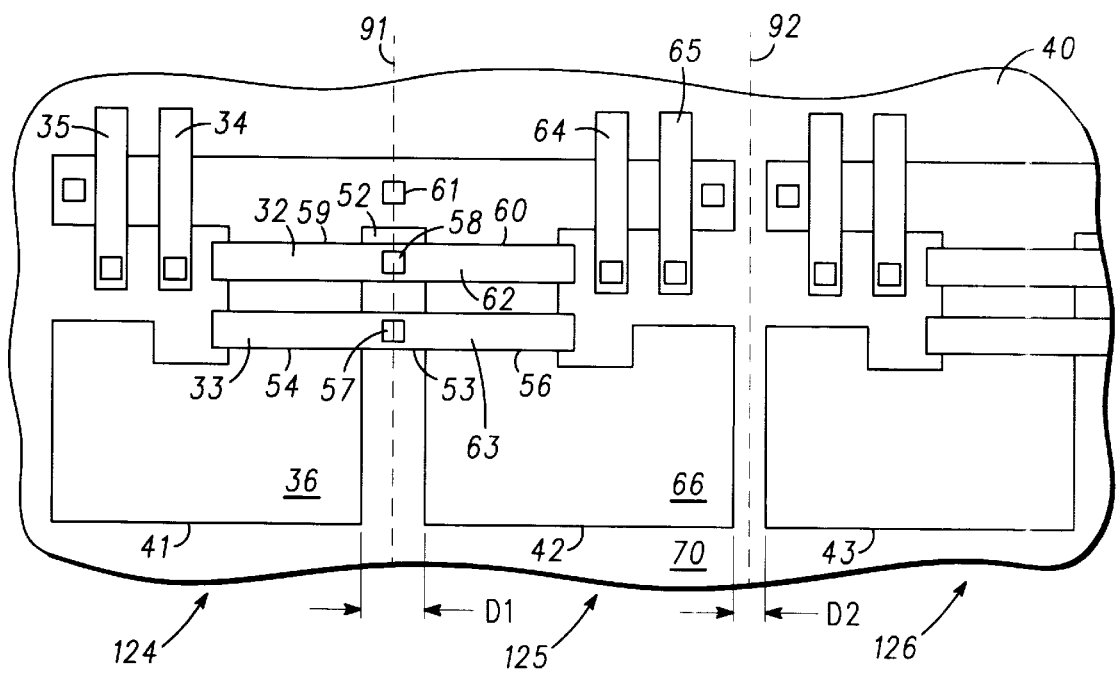
FIG. 5 is a top view of a detail of the imaging circuit in accordance with the present invention.

FIG. 5 is a top view of a detail of the physical layout of image capture circuit 10 in an integrated circuit embodiment, showing pixel circuits 124–126 formed in regions 41–43, respectively, of a substrate 40. Substrate 40 comprises a p-type semiconductor material such as silicon. Regions 41–43 are formed by lightly doping substrate 40 with an n-type dopant, and are biased to a positive potential in order to isolate regions 41–43 from each other to prevent crosstalk among pixel circuits. The portion of substrate 40 lying outside of regions 41–43 is designated as an isolation region 70, which is formed with a dielectric material such as silicon dioxide. Alternatively, isolation region 70 may comprise a p-type semiconductor material.

A contact 61 receives power supply voltage VDD for supplying direct current power to pixel circuits 124 and 125 and providing further isolation by absorbing signal fluctuations. Metal interconnections from contact 61 to a VDD supply terminal are not shown in FIG. 5 in order to simplify the description and more clearly show the invention. Other interconnections are also omitted from FIG. 5 to simplify the description.

Photoactive device 36 is formed by doping region 41 with a p-type dopant followed by a shallower n-type dopant to form a pn junction which generates a minority carrier charge in response to projected light. A high image quality is attained by forming pixel circuit 124 with as high a fill factor as possible. That is, photoactive device 36 preferably occupies as much of region 41 as is feasible within the constraints of the fabrication process. In addition, photoactive device 36 is left uncovered by subsequent interconnect layers (not shown) which could block the projected light. The photoactive devices in other pixel circuits are formed in a similar fashion. For example, photoactive device 66 is formed in region 42 of pixel circuit 125 as shown.

Transistors 32-35 are formed by depositing and patterning a layer of conductive material such as doped polysilicon on substrate 40 to define the channels or active areas of transistors 32–35. The active areas generally are those where the patterned conductive material overlaps region 41. The patterned conductive material then functions as a gate of the associated transistor to modify the conductivity of the underlying region of semiconductor substrate 40.

For example, one pattern of conductive material produces a conductor 52 which defines the channel of transistor 32 and functions as its gate electrode 59. Another conductive material pattern produces a conductor 53 which functions as a gate electrode 54 of transistor 33. Transistors 34–35 of pixel circuit 124 are formed similarly. In pixel circuit 125, conductor 52 functions as a gate electrode 60 of a transistor 62, while conductor 53 functions as a gate electrode 56 of transistor 63. Transistors 64–65 are similarly formed.

To avoid damaging the active areas of transistors during fabrication, electrical contacts between the conductive material and metal interconnect layers (not shown) are constrained to overlie isolation region 70 under worst case misalignment conditions. For example, contact 58 for coupling to node 17 overlies an isolation region a predetermined distance from regions 41 and 42. Similarly, contact 57 for coupling to column line 27 overlies an isolation region between regions 41 and 42. The width D1 of isolation region 70 between regions 41 and 42 is increased to accommodate the overlying contacts, which increases the die area and fabrication cost.

As a feature of the present invention, pixel circuits 124 and 125 are oriented symmetrically with respect to an axis 91 of semiconductor substrate 40. Similarly, pixel circuits 125 and 126 are oriented symmetrically about an axis 92 of semiconductor substrate 40. The symmetrical or mirrored layout allows conductor 52 to extend in a continuous fashion from region 41 to region 42 to function both as a gate electrode 59 of transistor 32 and a gate electrode 60 of transistor 62. Hence, contact 58 is effectively shared between pixel circuit 124 and pixel circuit 125. Similarly, conductor 53 is extended in a continuous pattern from region 41 to region 42 to form a gate electrode 54 of transistor 33 as well as a gate electrode 56 of transistor 63. Contact 58 is thereby shared between pixel circuit 124 and pixel circuit 125.

Previous imaging arrays require separate contacts in each pixel circuit, which requires large spacings between adjacent pixel circuits. As a feature of the present invention, contacts are shared between adjacent pixel circuits, which eliminates the need to provide a separate contacts in each pixel circuit. Rather, contacts are needed only in alternate pixel circuits of a row. For example, contacts are included between pixel circuits 124 and 125 but are not needed between pixel circuits 125 and 126. As a result, the distance D2 between pixel circuits 125 and 126 is made less than distance D1 between pixel circuits 124 and 125, which reduces the die area occupied by pixel circuits 124–126 without reducing the areas of the corresponding photoactive devices. The amount of light captured by pixel circuits 124–126 remains the same but the light is captured over a smaller die area. Hence, the fill factor is increased, which maintains or improves image quality.

Hence, the symmetrical layout and shared contacts of the present invention reduce the spacing between pixel circuits, thereby achieving a benefit of an increased fill factor and a reduced die area without requiring additional or more costly processing steps. A high image quality is achieved but at a reduced cost.

It should be appreciated that the present invention provides an imaging circuit with a lower cost and a performance equal to or better than that of prior imaging circuits. A substrate has first and second regions on which light is projected to produce first and second charges. A conductive material extends from the first region to the second region to transfer the first and second charges when a control signal is applied. The charges are sensed to produce an output signal of the imaging circuit.

What is claimed is:

1. An imaging circuit, comprising:
   a substrate having first and second regions for producing first and second charges, respectively, in response to a light signal;
   a conductive material disposed on the substrate to extend from the first region to the second region for modifying a conductivity of the substrate to transfer the first and second charges to an output of the imxaging circuit;
   a first pixel circuit formed in the first region; and
   a second pixel circuit formed in the second region, the first and second pixel circuits being oriented symmetrically about an axis of the substrate.

2. The imaging circuit of claim 1, further comprising:
   a first photoactive device disposed in the first region for generating the first charge; and
   a second photoactive device disposed in the second region for generating the second charge.

3. The imaging circuit of claim 2, further comprising:
a first transistor disposed in the first region for transferring the first charge from the first photoactive device; and
a second transistor disposed in the second region for transferring the second charge from the second photoactive device.

4. The imaging circuit of claim 3, wherein the conductive material operates as first and second gate electrodes of the first and second transistors, respectively.

5. The imaging circuit of claim 4, wherein the first and second transistors operate in response to a control signal applied to the conductive material.

6. The imaging device of claim 1, wherein the conductive material comprises polysilicon.

7. An integrated imaging circuit, comprising;
a semiconductor substrate;
a first pixel circuit for generating a first pixel signal in response to light projected on a first region of the semiconductor substrate;
a second pixel circuit for generating a second pixel signal in response to light projected on a second region of the semiconductor substrate, said first and second pixels circuits being disposed symmetrically about an axis of the semiconductor to substrate; and
a conductive layer disposed over the semiconductor substrate to extend from the first region to the second region for routing the first and second pixel signals to an output of the integrated imaging circuit.

8. The integrated imaging circuit of claim 7, wherein
the first pixel circuit includes a first photoactive device for receiving the light projected on the first region, and
the second pixel circuit includes a second photoactive device for receiving the light projected on the second region.

9. The integrated imaging circuit of claim 8, wherein the first pixel circuit includes a first control transistor coupled to the first photoactive device and the second pixel circuit includes a second control transistor coupled to the second photoactive device.

10. The integrated imaging circuit of claim 9, wherein the conductive layer functions as a first electrode of the first control transistor and a second electrode of the second control transistor.

11. The integrated imaging circuit of claim 10, wherein the first and second photoactive devices are disposed for generating first and second charges, respectively, in response to the light.

12. The integrated imaging circuit of claim 11, wherein a control signal is applied to the conductive layer for routing the first and second charges through the first and second control transistors to produce the first and second pixel signals, respectively.

13. The integrated imaging circuit of claim 12, wherein the first pixel circuit includes a first selection transistor having a conduction path coupled to the first control transistor for producing the first pixel signal with a first selection signal, and the second pixel circuit includes a second selection transistor having a conduction path coupled to the second control transistor for producing the second pixel signal with a second selection signal.

14. The integrated imaging circuit of claim 13, further comprising a decoder for producing the first and second selection signals in response to first and second address signals, respectively.

15. The integrated imaging circuit of claim 14, wherein the decoder provides random access to the first and second pixel circuits.

\* \* \* \* \*